United States Patent [19]

Jones et al.

[11] Patent Number: 4,835,469

[45] Date of Patent: May 30, 1989

[54] INTEGRATED CIRCUIT CLIP FOR CIRCUIT ANALYZER

[75] Inventors: Wayne R. Jones, Alderwood Manor; Daniel J. Voss, Seattle, both of Wash.

[73] Assignee: John Fluke Mfg. Co., Inc., Everett, Wash.

[21] Appl. No.: 77,648

[22] Filed: Jul. 24, 1987

[51] Int. Cl.4 .......................... G01R 1/04; G01R 1/06
[52] U.S. Cl. ............................... 324/158 F; 324/72.5; 324/73 PC; 324/158 P; 324/73 R
[58] Field of Search ............... 324/72.5, 73 PC, 73 R, 324/73 T, 49, 158 R, 158 P, 158 F; 439/819–824

[56] References Cited

U.S. PATENT DOCUMENTS

| | | | |
|---|---|---|---|
| 3,667,037 | 5/1972 | Kierce | 324/73 R |
| 3,702,423 | 11/1972 | Kern | 324/158 F |
| 3,870,953 | 3/1975 | Boatman et al. | 324/73 R |
| 3,882,386 | 5/1975 | Vinsani | 324/73 R |
| 3,946,310 | 3/1976 | Saper et al. | 324/72.5 |
| 4,055,800 | 10/1977 | Fisk et al. | 324/158 F |
| 4,055,806 | 10/1977 | Patel | 324/158 F |
| 4,132,946 | 1/1979 | Holdren et al. | 324/158 P |
| 4,455,654 | 6/1984 | Bhaskar et al. | 324/73 R |

FOREIGN PATENT DOCUMENTS

| | | | |
|---|---|---|---|
| 0181806 | 5/1986 | European Pat. Off. | 324/158 P |
| 0195556 | 9/1986 | European Pat. Off. | 324/158 P |

OTHER PUBLICATIONS

"Circuit Test Point Switch", IBM Tech. Disc. Bull., vol. 16, #9, p. 2778, by Stokan.

*Primary Examiner*—Reinhard J. Eisenzopf
*Assistant Examiner*—W. Burns
*Attorney, Agent, or Firm*—Mikio Ishimaru; Steve Becker

[57] ABSTRACT

In a system for troubleshooting a unit containing microprocessor-based digital circuitry including a bus, wherein the system includes a digital test apparatus that emulates the microprocessor of the unit to test components on the bus and a device for interfacing signals between the test apparatus and the microprocessor comprises a clip that mounts to the microprocessor in electrical contact with the microprocessor leads. The clip preferably is of a type adapted to attach resiliently to the leads of all four sides of a soldered-in microprocessor in a leaded chip carrier housing. A connector to couple the clip to the test apparatus through a wire harness is mounted on a printed circuit board carrying pins corresponding to the lines of the microprocessor bus and the clip, and cables extending from the circuit board to the clip are coupled to the pins of the circuit board and clip by push connectors. A rod interconnecting the clip and the circuit board maintains the distance between the clip and circuit board fixed to prevent the push connectors from "backing off" the pins as the clip is manually operated. A pair of "flying leads", extending from the circuit board, carries probes that clip to terminals of the unit under test.

27 Claims, 3 Drawing Sheets

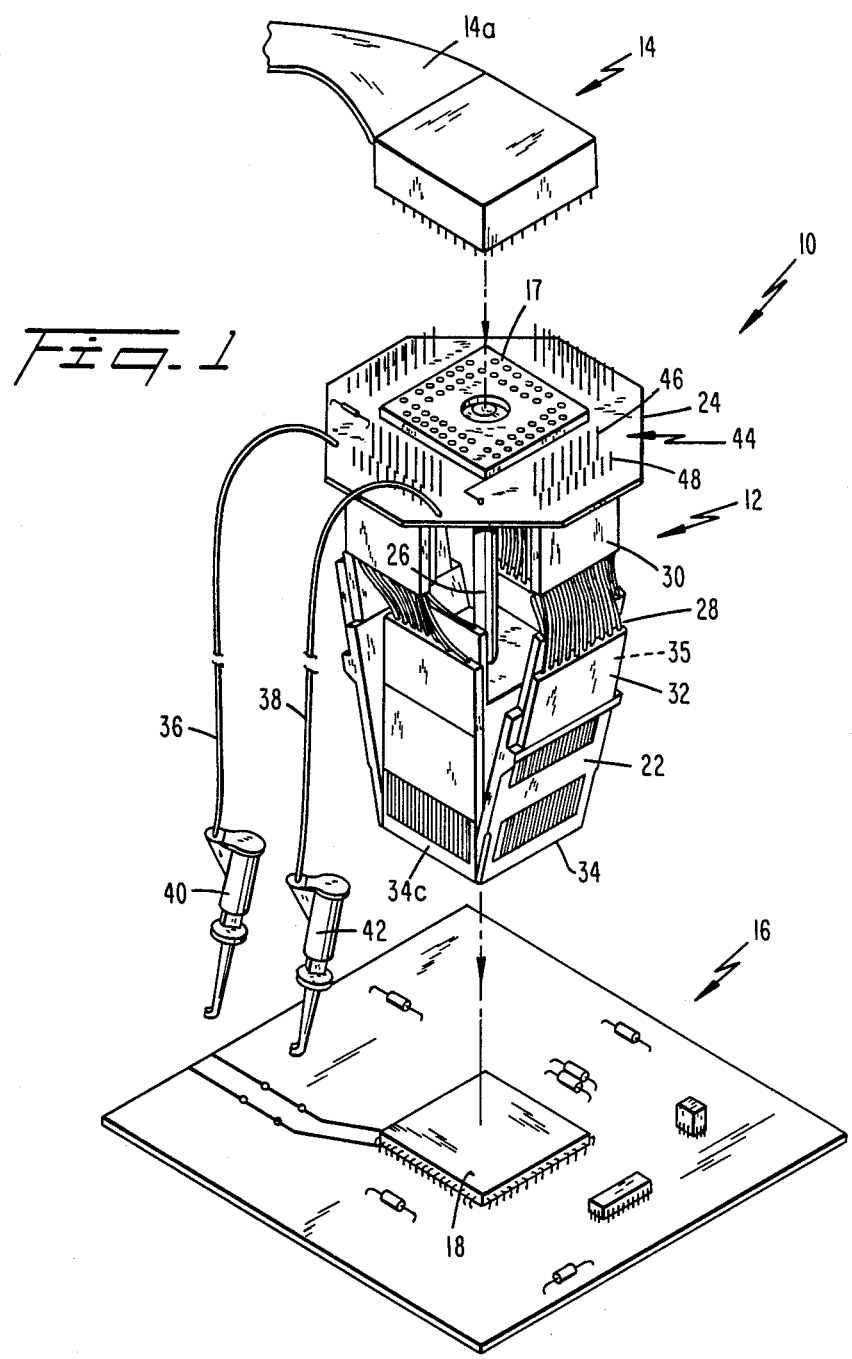

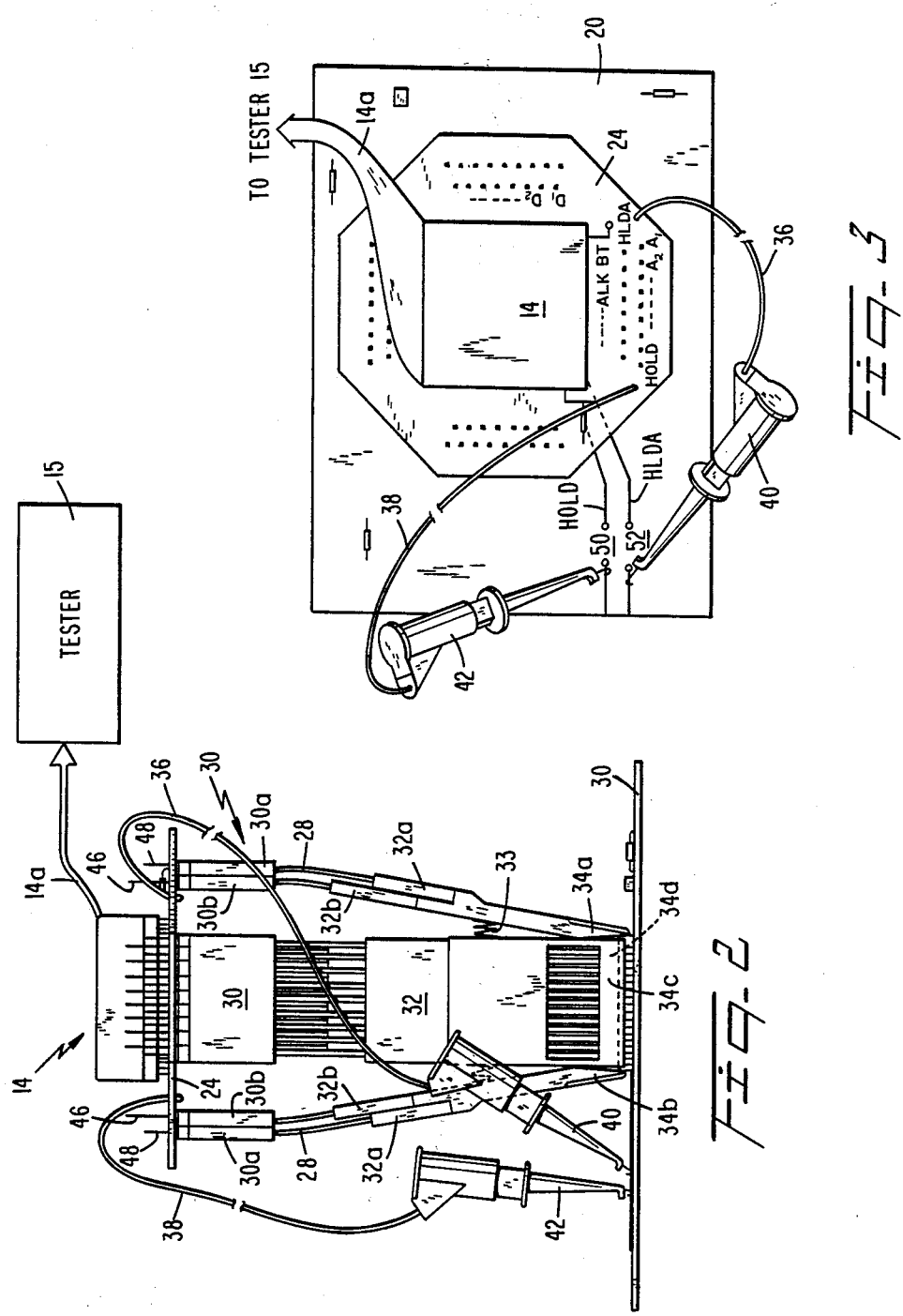

INTEGRATED CIRCUIT CLIP FOR CIRCUIT ANALYZER

TECHNICAL FIELD

This invention is related generally to test clips for integrated circuits, and more particularly, toward a novel test clip that interfaces soldered-in bus oriented microprocessors with an automated fault isolation apparatus that implements microprocessor emulation to troubleshoot components on the bus.

BACKGROUND ART

In one type of automated testing equipment for microprocessor based digital circuitry in a unit under test, the microprocessor is removed from its socket and replaced by a plug to which is connected a tester that applies signals to the bus of the unit. The tester, which includes a microprocessor that emulates the microprocessor of the unit under test, applies signals on the bus at addresses corresponding to various components on the bus whose functions are to be tested. The automated testing equipment is programmed to compare signals read from the bus at addresses throughout the unit under test with predetermined signals to isolate circuit faults. An example of such automated testing equipment is given in Scott et al. U.S. patent application Ser. No. 761,027, filed on July 29, 1985, assigned to the assignee of this invention and incorporated herein by reference.

Operation of automated testing equipment of this type requires that the microprocessor be socketed so that it can be removed for replacement by the plug of the tester that will apply signals to and read response signals from the bus of the unit under test. However, to reduce the cost, and improve reliability of, microprocessor-based circuits there is a trend toward soldered-in, rather than socketed, semiconductor integrated circuits. A need therefore exists to apply automated testing equipment of the type described to soldered-in microprocessors and other semiconductor devices within units under test.

Accordingly, one object of the invention is to apply automated testing equipment to soldered-in semiconductor devices of a unit under test.

Another object of the invention is to provide an adapter clip to connect to the leads of a soldered-in integrated circuit within a bus-oriented, microprocessor-based unit under test for interfacing the unit with automated testing equipment emulating the unit microprocessor.

Another object of the invention is to provide access to all signal pins of a soldered-in integrated circuit through extended test points and to identify the functions of the pins by name.

Still another object is to provide an adapter clip of a type described that has good mechanical and electrical integrity, and is easily applied to and removed from an integrated circuit within a unit under test.

A further object of the invention is to provide an adapter clip of the type described that is economically manufactured using conventional and commercially available components.

DISCLOSURE OF INVENTION

In accordance with the invention, in a system for isolating faults in a unit under test having microprocessor-based digital circuitry including a bus, a digital test apparatus includes means emulating a microprocessor within the circuitry for applying emulation test signals to the bus and means responsive to measurement signals on the bus to develop troubleshooting information relating to the microprocessor-based digital circuitry. A device for interfacing emulation test and measurement signals between the digital test apparatus and the microprocessor, maintained in-circuit during the test, comprises a clip having electrical terminals positioned to contact corresponding electrical terminals of the in-circuit microprocessor and manually operable means for resiliently retaining the clip in electrical contact with the in-circuit microprocessor. A connector, which in the preferred embodiment is mounted on a printed circuit board of the clip, electrically couples signal wires to the digital test apparatus. A cable, e.g., a ribbon cable means or a series of separate wires, interconnects the printed circuit board and the clip, and a rigid support element such as a rod extending between the printed circuit board and the clip maintains the printed circuit board and the clip separated from each other by a fixed distance. In the preferred embodiment, one end of the rod is screwed to the clip and the opposite end of the rod is swaged to the printed circuit board.

In accordance with another aspect of the invention, a connector means releasably couples the cable means to the printed circuit board and the clip. Preferably, wire leads extending from the printed circuit board terminate in probe clip means for clipping the wire leads to conductors within the unit under test. The wire leads in practice are coupled to the HOLD and HLDA lines or equivalent lines on the unit bus, bypassing the in-circuit microprocessor, so that the emulation microprocessor in the tester is enabled by signals on the bus.

In accordance with another aspect of the invention, the printed circuit board includes test pins extending therefrom, interconnected with corresponding conductors of the cable. In the preferred embodiment, the test pins are arranged in two parallel rows of terminal pins to simulate the orientation of corresponding leads of the integrated circuit. The pins of the outside row are advantageously shorter than those of the inside row for more convenient simultaneous access to pins in both rows. In accordance with a further aspect, the printed circuit board has imprinted thereon descriptive markings at the test pins.

In the preferred embodiment, the clip comprises a four-sided clip having electrical terminals corresponding in position to the terminals of a four-sided microprocessor. For example, each side of a clip adapted to a sixty-eight pin microprocessor package includes seventeen electrical terminals on each of the four sides of the clip.

In accordance with another aspect of the invention, the clip includes a series of first extending pins connected to the electrical terminals of the clip, the printed circuit board includes a series of second pins adapted to contact with the connector, and opposite ends of the cable include push connector means for interconnecting the first and second pins. Preferably, the first pins of the clip are arranged in first and second rows, and one end of the ribbon cable includes first and second push connectors for attachment respectively to the first and second rows of pins. Because the rod rigidly fixes the distance between printed circuit board and the clip, and the cable is very flexible, the push connectors are prevented from "backing off" the pins of the clip as the clip is manually operated for attachment to and removal from in-circuit microprocessors.

Still other objects and advantages of the present invention will become readily apparent to those skilled in this art from the following detailed description, wherein we have shown and described only the preferred embodiment of the invention, simply by way of illustration of the best mode contemplated by us of carrying out our invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

FIG. 1 is a perspective view of the integrated circuit test clip of the invention to be attached to a sixty-eight pin leaded chip carrier;

FIG. 2 is a side view of the clip mounted to the chip carrier, with the "flying leads" clipped to the circuit board under test;

FIG. 3 is a top view corresponding to FIG. 2, with the HOLD and HLDA leads of the circuit board under test bypassed by the "flying leads" of the invention.

BEST MODE FOR PRACTICING THE INVENTION

Figure 4:
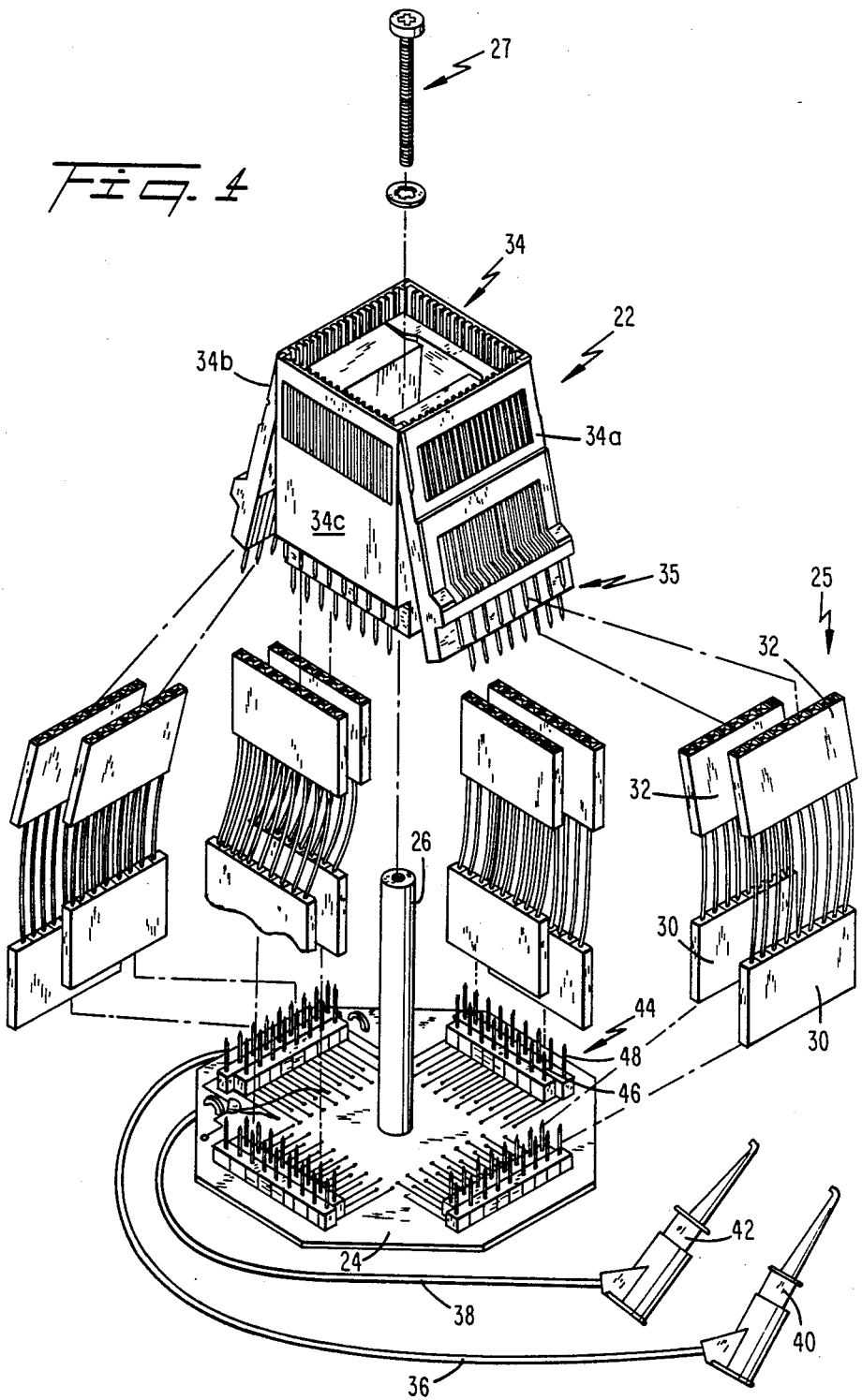
FIG. 4 is an exploded view corresponding to FIG. 1, showing more clearly the construction of the test clip.

With reference to FIGS. 1-4, a test clip adapter 10, in accordance with the invention, comprises a test clip assembly 12 adapted to interface to an automated tester 15, such as an 80286 Pod and 9100A digital test system manufactured by John Fluke Mfg. Co., Everett, Wash., through a standard connector plug 14 and a ribbon cable 14a. The assembly 12 mounts to a soldered-in microprocessor 18 of a unit under test (UUT) 16, which in the preferred embodiment comprises a printed circuit board 20 carrying electrical components including the microprocessor 18. Microprocessor 18 may be any one of a variety of different types to which the assembly 12 can be adapted to mount for testing the UUT 16. In the example of the preferred embodiment described herein, the microprocessor 18 is an 80286 type microprocessor in a sixty-eight pin leaded chip carrier having seventeen pins on each of its four sides. The tester 15 contains a microprocessor (not shown) that emulates the microprocessor 18 of the UUT 16 and performs diagnostic testing of the microprocessor bus, as described in the Scott et al. application, supra.

The test clip assembly 12 comprises a clip 22, which in the preferred embodiment comprises a sixty-eight position surface mount test clip, manufactured as part number 930267-pb 68 or 923675-68 by AP Products, Inc., Mentor, Ohio. The clip 22, shown more clearly in FIGS. 2 and 4, comprises four-sided jaws 34 adapted to clip over the microprocessor 18, with the pins (not shown) of the jaws in contact with the corresponding pins of the microprocessor. Opposite sections 34a, 34b of the jaws 34 are pivotally mounted to the clip 22, biased inward in contact with the microprocessor by springs 33. The remaining two jaw sections 34c, 34d also pivotally mounted to the clip, are internally cammed (not shown) to the sections 34a, 34b so that as sections 34a, 34b are manually squeezed, all four sections pivot open simultaneously to release the clip 22 from the microprocessor 18.

The assembly 12 further includes a socket 17, which in the preferred embodiment comprises a sixty-eight pin, pin grid array manufactured as part number PGA-068-CM3-S-TG30 by Robinson Nugent, mounted on a printed circuit board 24 that is spaced from the clip 22 by a spacer 26 that preferably is in the form of a brass rod swaged to the board 24 and, through an aperture drilled through clip 22, screwed by bolt 27 to the clip, as best shown in FIG. 4. The socket 17 is adapted to receive the plug 14 to interface signals between the printed circuit board 24 and the tester 15.

Extending through the printed circuit board 24 are pins 44 oriented in two rows 46, 48 on each side of the board, simulating the orientation of the pins of the 80286 microprocessor 18. In this example, the two rows 46, 48 of pins on each of the four sides of the board 24 consist of seventeen pins. Of course, if the test clip assembly 12 is adapted to clip to a different type of microprocessor, the number and orientation of the pins 44 will be correspondingly different. The pins 44, which correspond respectively to the sixty-eight pins of microprocessor 18, enable the microprocessor lines to be electrically probed by the user. In the example shown, the pins of the inner row 46 are longer than those of the outer row 48 to enable signals on adjacent pins of the inner and outer rows to be conveniently simultaneously measured using two different probes. Furthermore, to aid the user in troubleshooting the microprocessor 18, the outer surface of the board 24, visible to the user, preferably carries markings identifying the names of the microprocessor pins, as shown in FIG. 3.

Interconnecting the pins 44 of printed circuit board 24 and corresponding pins 35 (FIG. 4) of the clip 22 on each side of the assembly 12 is a cable 25 having a pair of single row connectors 30 and 32 that "push onto" corresponding rows of pins 44 and 35. The connectors 30b, 32b and 30a, 32a. Which are eight pin and nine pin receptacles, respectively, may be of a type manufactured by Amp, Inc., Harrisburg, Pa. as Series AMP-MODU MTE receptacles. The cable 25 in the preferred embodiment is forced of a series of seventeen wires that preferably comprises separate wires as shown but may alternatively be in the form of a ribbon cable or PWB flex circuit. In either case, it is important that the cable 25 be very flexible to prevent stiffness of the wires from causing connectors 30 and 32 from "backing off" the pins 44 and 35 as the clip is manually "worked" during attachment of the clip to and removal from the microprocessor 18. The connectors are furthermore retained to the pins 44 and 35 by the rigidity of the spacer 26 that fixes the distance between the board 24 and clip 22. Connectors 32, in addition to electrically coupling the clip pins 25 to wires 28, extends the lever arm of clip sections 34a, 34b to ease the manual opening of the clip 12.

Extending from the circuit board 24 of the assembly 12 is a pair of "flying leads" 36,38 connected to the HOLD and HLDA lines or equivalent lines of the emulation microprocessor in tester 15 and terminating at probe clips 42 and 40, respectively. The probe clips 40 and 42 which are adapted to connect to the HOLD and HLDA lines or equivalent lines on the bus of the UUT 16, bypassing open jumpers at 50,52 shown in FIG. 3.

The "flying leads" 36, 38 and removable jumpers 50, 52 enable the tester 15 to interrogate the microprocessor bus of the UUT 16 without physically removing the soldered-in microprocessor 18 from the circuit board 20 by unsoldering. Ordinarily, to test a UUT with a soldered-in microprocessor, it is necessary to tri-state the output signals of the processor in the board by asserting the HOLD line of the bus. If HOLD/HLDA is used as an alternate bus master, DMA device or RAM refresh, the tester 15 must monitor those lines of the bus, yet the soldered-in microprocessor lines must be isolated from the rest of the UUT circuit and tester. Thus, to electrically remove microprocessor 18 from the bus, and electrically insert in its place the emulation microprocessor of the tester 15. the HOLD and HLDA lines on the circuit board 20 of UUT 16 are opened at 50 and 52 and bypassed by the "flying leads" 36,38 to the HOLD and HLDA bus lines of the printed circuit board 24. This is carried out by removing cable jumpers (not shown) at 50,52 on the board 20 and clipping probes 40,42 to test points on the isolated HOLD and HLDA lines, as shown in FIG. 3. The bus of the UUT is then exercised by the tester 15 in the manner described in the Scott et al. application, aid following the test, the assembly 12 is removed from the microprocessor 18.

There has accordingly been described a novel test clip adapter that enables automated testing equipment to be applied to the bus of a unit under test through a soldered-in semiconductor device of the unit. The clip more specifically connects to the leads of a soldered-in integrated circuit within a bus-oriented, microprocessor-based unit under test for interfacing the unit with automated testing equipment emulating the unit microprocessor. Access to all signal pins of the soldered-in integrated circuit is provided through extended test points and markings identify the functions of the pins by name. The adapter clip has good mechanical and electrical integrity, and is easily applied to and removed from ah integrated circuit within a unit under test. The clip furthermore is economically manufactured using conventional and commercially available components.

In this disclosure. there is shown and described only the preferred embodiment of the invention, but, as aforementioned, it is to be understood that the invention is capable of use in various other combinations and environments and is capable of changes or modifications wherein the scope of the invention concept as expressed herein.

What is claimed is:

1. In a system for isolating faults in a unit under test having microprocessor-based digital circuitry including a bus, the system including a digital test apparatus having means emulating a microprocessor within the circuitry for applying emulation test signals to the bus and means responsive to measurement signals on the bus to develop troubleshooting information relating to the microprocessor-based digital circuitry, a device for interfacing emulation test and measurement signals between the digital test apparatus and the microprocessor, wherein the microprocessor is maintained incircuit with the unit under test, the device comprising:
(a) a clip having electrical terminals positioned to contact corresponding electrical terminals of the in-circuit microprocessor and manually operable means for resiliently retaining the clip in electrical contact with the in-circuit microprocessor;
(b) a printed circuit board having a connector for electrically connecting signal wires to the digital test apparatus;
(c) a cable means interconnecting the printed circuit board and the clip; and
(d) a rigid elongated support element electrically isolated from said clip terminals and having at least a portion thereof extending longitudinally between the printed circuit board and the clip to maintain the printed circuit board and the clip separated from each other by a fixed distance.

2. In a system for isolating faults in a unit under test having microprocessor-based digital circuitry including a bus, the system including a digital test apparatus having means emulating a microprocessor within the circuitry for applying emulation test signals to the bus and means responsive to measurement signals on the bus to develop troubleshooting information relating to the microprocessor-based digital circuitry, a device for interfacing emulation test and measurement signals between the digital test apparatus and the microprocessor, wherein the microprocessor is maintained incircuit with the unit under test, the device comprising:
(a) a clip having electrical terminals positioned to contact corresponding electrical terminals of the in-circuit microprocessor and manually operable means for resiliently retaining the clip in electrical contact with the in-circuit microprocessor;
(b) a printed circuit board having a connector for electrically connected signal wires to the digital test apparatus;
(c) a cable means interconnecting the printed circuit board and the clip; and
(d) a rigid elongated support element having at least a portion thereof extending longitudinally between the printed circuit board and the clip to maintain the printed circuit board and the clip separated from each other by a fixed distance;
including the cable connector means for releasably coupling the cable means to the printed circuit board and to the clip.

3. The device of claim 1, including wire leads extending from the printed circuit board and terminating in probe means for connecting the wire leads to conductors within the unit under test.

4. The device of claim 1, wherein the rigid elongated support element comprises a rod extending longitudinally between the printed circuit board and the clip.

5. The device of claim 1, wherein the printed circuit board includes test pins extending therefrom and interconnected with corresponding conductors of the cable means.

6. The device of claim 5, wherein the test pins are arranged in two parallel rows of terminal pins, the pins of one of the rows being longer than those of the of the other row.

7. The device of claim 5, wherein the printed circuit board has imprinted thereon descriptive markings at the test pins.

8. The device of claim 1, wherein the clip comprises a four-sided clip having electrical terminals corresponding in position to the terminals of said microprocessor.

9. The device of claim 8, wherein each side of the four-sided clip includes seventeen electrical terminals.

10. In a system for isolating faults in a unit under test having microprocessor-based digital circuitry including a bus, the system including a digital test apparatus having means emulating a microprocessor within the circuitry for applying emulation test signals to the bus and means responsive to measurement signals on the bus to develop troubleshooting information relating to the microprocessor-based digital circuitry, a device for interfacing emulation test and measurement signals between the digital test apparatus and the microprocessor, wherein the microprocessor is maintained in-circuit with the unit under test, the device comprising:
  (a) a clip having electrical terminals positioned to contact corresponding electrical terminals of the in-circuit microprocessor and manually operable means for resiliently retaining the clip in electrical contact with the in-circuit microprocessor;
  (b) a printed circuit board having a connector for electrically connecting signal wires to the digital test apparatus;
  (c) a cable means interconnecting the printed circuit board and the clip; and
  (d) a rigid elongated support element having at least a portion thereof extending longitudinally between the printed circuit board and the clip to maintain the printed circuit board and the clip separated from each other by a fixed distance;
  wherein the clip includes a series of first extending pins connected to the electrical terminals of the clip, the printed circuit board includes a series of second pins adapted to contact with the first connector, and opposite ends of the cable means includes a push connector means for interconnecting the first and second pins.

11. The device of claim 10, wherein the first pins of the clip are arranged in first and second rows, and opposite ends of the cable means include first and second push connectors for attachment respectively to the first and second rows of pins.

12. In a system for isolating faults in a unit under test having microprocessor-based digital circuitry including a bus, the system including a digital test apparatus having means emulating a microprocessor within the circuitry for applying emulation test signals to the bus and means responsive to measurement signals on the bus to develop troubleshooting information relating to the microprocessor-based digital circuitry,
  a device for interfacing emulation test and measurement signals between the digital test apparatus and the microprocessor, wherein the microprocessor is maintained incircuit with the unit under test, the device comprising:
  (a) a clip having electrical terminals positioned to contact corresponding electrical terminals of the in-circuit microprocessor and manually operable means for resiliently retaining the clip in electrical contact with the in-circuit microprocessor;
  (b) a printed circuit board having a connector for electrically connecting signal wires to the digital test apparatus;
  (c) a cable means interconnecting the printed circuit board and the clip; and
  (d) a rigid elongated support element having at least a portion thereof extending longitudinally between the printed circuit board and the clip to maintain the printed circuit board and the clip separated from each other by a fixed distance;
  wherein the rigid support element comprises a rod extending longitudinally between the printed circuit board and the clip;
  wherein the one end of the rod is swaged to the printed circuit board and the opposite end of the rod is screwed to the clip.

13. In a system for isolating faults in a unit under test having microprocessor-based digital circuitry including a bus, the system including a digital test apparatus having means emulating a microprocessor within the circuitry for applying emulation test signals to the bus and means responsive to measurement signals on the bus to develop troubleshooting information relating to the microprocessor-based digital circuitry, a device for interfacing emulation test and measurement signals between the digital test apparatus and the microprocessor, wherein the microprocessor is maintained in-circuit with the unit under test, the device comprising:
  (a) a clip having electrical terminals positioned to contact corresponding electrical terminals of the in-circuit microprocessor and manually operable means for resiliently retaining the clip into electrical contact with the in-circuit microprocessor;
  (b) first connector means for electrically connecting signals wires to the digital test apparatus;
  (c) a cable means interconnecting the first connector means and the clip; and
  (d) a rigid elongated support element having at least a portion thereof extending longitudinally between and through the center of the first connector means and the clip separated from each other by a fixed distance, said support element being located centrally with respect to said first connector means and said clip.

14. In a system for isolating faults in a unit under test having microprocessor-based digital circuitry including a bus, the system including a digital test apparatus having means emulating a microprocessor within the circuitry for applying emulation test signals to the bus and means responsive to measurement signals on the bus to develop troubleshooting information relating to the microprocessor-based digital circuitry, a device for interfacing emulation test and measurement signals between the digital test apparatus and the microprocessor, wherein the microprocessor is maintained in-circuit with the unit under test, the device comprising:
  (a) a clip having electrical terminals positioned to contact corresponding electrical terminals of the in-circuit microprocessor and manually operable means for resiliently retaining the clip into electrical contact with the in-circuit microprocessor;
  (b) first connector means for electrically connecting signal wires to the digital test apparatus;
  (c) a cable means interconnecting the first connector means and the clip; and
  (d) a rigid elongated support element having at least a portion thereof extending longitudinally between the first connector means and the clip separated from each other by a fixed distance;
  wherein the connector means includes a printed circuit board and a leaded chip carrier connected to the board.

15. In a system for isolating faults in a unit under test having microprocessor-based digital circuitry including a bus, the system including a digital test apparatus having means emulating a microprocessor within the circuitry for applying emulation test signals to the bus and means responsive to measurement signals on the bus to develop troubleshooting information relating to the microprocessor-based digital circuitry, a device for interfacing emulation test and measurement signals between the digital test apparatus and the microprocessor, wherein the microprocessor is maintained incircuit with the unit under test, the device comprising:
  (a) a clip having electrical terminals positioned to contact corresponding electrical terminals of the in-circuit microprocessor and manually operable means for resiliently retaining the clip into electrical contact with the in-circuit microprocessor;
(b) first connector means for electrically connecting signal wires to the digital test apparatus;
(c) a cable means interconnecting the first connector means and the clip; and
(d) a rigid elongated support element having at least a portion thereof extending longitudinally between the first connector means and the clip separated from each other by a fixed distance;
including second connector means for releasably coupling the cable means to the first connector means and the clip.

16. In a system for isolating faults in a unit under test having microprocessor-based digital circuitry including a bus, the system including a digital test apparatus having means emulating a microprocessor within the circuitry for applying emulation test signals to the bus and means responsive to measurement signals on the bus to develop troubleshooting information relating to the micrprocessor-based digital circuitry, a device for interfacing emulation test and measurement signals between the digital test apparatus and the microprocessor, wherein the microprocessor is maintained incircuit with the unit under test, the device comprising:
(a) a clip having electrical terminals positioned to contact corresponding electrical terminals of the in-circuit microprocessor and manually operable means for resiliently retaining the clip into electrical contact with the in-circuit microprocessor;
(b) first connector means for electrically connecting signal wires to the digital test apparatus;
(c) a cable means interconnecting the first connector means and the clip; and
(d) a rigid elongated support element having at least a portion thereof extending longitudinally between the first connector means and the clip separated from each other by a fixed distance;
including wire leads extending from the first connector means and terminating in probe means for connecting the wire leads to conductors within the unit under test.

17. In a system for isolating faults in a unit under test having microprocessor-based digital circuitry including a bus, the system including a digital test apparatus having means emulating a microprocessor within the circuitry for applying emulation test signals to the bus and means responsive to measurement signals on the bus to develop troubleshooting information relating to the microprocessor-based digital circuitry, a device for interfacing emulation test and measurement signals between the digital test apparatus and the microprocessor, wherein the microprocessor is maintained incircuit with the unit under test, the device comprising:
(a) a clip having electrical terminals positioned to contact corresponding electrical terminals of the in-circuit microprocessor and manually operable means for resiliently retaining the clip into electrical contact with the in-circuit microprocessor;
(b) first connector means for electrically connecting signal wires to the digital test apparatus;
(c) a cable means interconnecting the first connector means and the clip; and
(d) a rigid elongated support element having at least a portion thereof extending longitudinally between the first connector means and the clip separated from each other by a fixed distance;
wherein the rigid elongated support element comprises a rod extending longitudinally between the first connector means and the clip.

18. In a system for isolating faults in a unit under test having microprocessor-based digital circuitry including a bus, the system including a digital test apparatus having means emulating a microprocessor within the circuitry for applying emulation test signals to the bus and means responsive to measurement signals on the bus to develop troubleshooting information relating to the microprocessor-based digital circuitry, a device for interfacing emulation test and measurement signals between the digital test apparatus and the microprocessor, wherein the microprocessor is maintained in-circuit with the unit under test, the device comprising:
(a) a clip having electrical terminals positioned to contact corresponding electrical terminals of the in-circuit microprocessor and manually operable means for resiliently retaining the clip into electrical contact with the in-circuit microprocessor;
(b) first connector means for electrically connecting signal wires to the digital test apparatus;
(c) a cable means interconnecting the first connector means and the clip; and
(d) a rigid elongated support element having at least a portion thereof extending longitudinally between the first connector means and the clip separated from each other by a fixed distance;
wherein the first connector means includes test pins extending therefrom and interconnected with corresponding conductors of the cable means.

19. In a system for isolating faults in a unit under test having microprocessor-based digital circuitry including a bus, the system including a digital test apparatus having means emulating a microprocessor within the circuitry for applying emulation test signals to the bus and means responsive to measurement signals on the bus to develop troubleshooting information relating to the microprocessor-based digital circuitry, a device for interfacing emulation test and measurement signals between the digital test apparatus and the microprocessor, wherein the microprocessor is maintained in-circuit with the unit under test, the device comprising:
(a) a clip having electrical terminals positioned to contact corresponding electrical terminals of the in-circuit microprocessor and manually operable means for resiliently retaining the clip into electrical contact with the in-circuit microprocessor;
(b) first connector means for electrically connecting signal wires to the digital test apparatus;
(c) a cable means interconnecting the first connector means and the clip; and
(d) a rigid elongated support element having at least a portion thereof extending longitudinally between the first connector means and the clip separated from each other by a fixed distance;
wherein the test pins are arranged in two parallel rows of terminal pins, the pins of one of the rows being longer than those of the other row.

20. The device of claim 18, wherein the printed circuit board has imprinted thereon descriptive markings at the extending test pins.

21. The device of claim 13, wherein the clip comprises a four-sided clip having electrical terminals corresponding in position to the terminals of said microprocessor.

22. The device of claim 21, wherein each side of the four-sided clip includes seventeen electrical terminals.

23. In a system for isolating faults in a unit under test having microprocessor-based digital circuitry including a bus, the system including a digital test apparatus having means emulating a microprocessor within the circuitry for applying emulation test signals to the bus and means responsive to measurement signals on the bus to develop troubleshooting information relating to the microprocessor-based digital circuitry, a device for interfacing emulation test and measurement signals between the digital test apparatus and the microprocessor, wherein the microprocessor is maintained in-circuit with the unit under test, the device comprising:
   (a) a clip having electrical terminals positioned to contact corresponding electrical terminals of the in-circuit microprocessor and manually operable means for resiliently retaining the clip into electrical contact with the in-circuity microprocessor;
   (b) first connector means for electrically connecting signal wires to the digital test apparatus;
   (c) a cable means interconnecting the first connector means and the clip; and
   (d) a rigid elongated support element having at least a portion thereof extending longitudinally between the first connector means and the clip separated from each other by a fixed distance;
   wherein the clip includes a series of first extending pins connected to the electrical terminals of the clip, the first connector means includes a series of second pins, and the opposite ends of the cable means include push connector means for interconnecting the first and second pins.

24. The device of claim 21, wherein the first pins of the clip are arranged in first and second rows, and one end of the cable means includes first and second push connectors for attachment respectively to the first and second rows of pins.

25. In a system for isolating faults in a unit under test having microprocessor-based digital circuitry including a bus, the system including a digital test apparatus having means emulating a microprocessor within the circuitry for applying emulation test signals to the bus and means responsive to measurement signals on the bus to develop troubleshooting information relation to the microprocessor-based digital circuitry, a device for interfacing emulation test and measurement signals between the digital test apparatus and the microprocessor, wherein the microprocessor is maintained incircuit with the unit under test, the device comprising:
   (a) a clip having electrical terminals positioned to contact corresponding electrical terminals of the in-circuit microprocessor and manually operable means for resiliently retaining the clip into electrical contact with the in-circuit microprocessor;
   (b) first connector means for electrically connecting signal wires to the digital test apparatus;
   (c) a cable means interconnecting the first connector means and the clip;
   (d) a rigid support element extending between the connector means and the clip to maintain the first connector means and the clip separated from each other by a fixed distance; and
   (e) second connector means for releasably coupling the cable means to the first connector means and the clip.

26. In a system for isolating faults in a unit under test having microprocessor-based digital circuitry including a bus, the system including a digital test apparatus having means emulation a microprocessor within the circuitry for applying emulation test signals to the bus and means responsive to measurement signals on the bus to develop troubleshooting information relating to the microprocessor-based digital circuitry, a device for interfacing emulation test and measurement signals between the digital test apparatus and the circuit with the unit under test, the device comprising:
   (a) a clip having electrical terminals positioned to contact corresponding electrical terminals of the in-circuit microprocessor and manually operable means for resiliently retaining the clip into electrical contact with the in-circuit microprocessor;
   (b) first connector means for electrically connecting signal wires to the digital test apparatus;
   (c) a cable means interconnecting the first connector means and the clip; and
   (d) a rigid elongated support element having at least a portion thereof extending longitudinally between the first connector means and the clip separated from each other by a fixed distance;
   wherein the clip comprises a four-sided clip having electrical terminals corresponding in position to the terminals of a four-sided microprocessor
   wherein said cable means comprises a plurality of flexible wires.

27. In a system for isolating faults in a unit under test having microprocessor-based digital circuitry including a bus, the system including a digital test apparatus having means emulating a microprocessor within the circuitry for applying emulation test signals to the bus and means responsive to measurement signals on the bus to develop troubleshooting information relating to the microprocessor-based digital circuitry, a device for interfacing emulation test and measurement signals between the digital test apparatus and the microprocessor, wherein the microprocessor is maintained in-circuit with the unit under test, the device comprising:
   (a) a clip having electrical terminals positioned to contact corresponding electrical terminals of the in-circuit microprocessor and manually operable means for resiliently retaining the clip into electrical contact with the in-circuit microprocessor;
   (b) first connector means for electrically connecting signal wires to the digital test apparatus;
   (c) a cable means interconnecting the first connector means and the clip; and
   (d) a rigid elongated support element having at least a portion thereof extending longitudinally between the first connector means and the clip separated from each other by a fixed distance;
   wherein said cable means comprises a plurality of flexible wires.

* * * * *